(12) United States Patent
Tucker (10) Patent No.: US 9,091,719 B2
(45) Date of Patent: *Jul. 28, 2015

(54) SYSTEMS AND METHODS OF IDENTIFYING CONNECTIONS IN A COMMUNICATIONS PATCHING SYSTEM USING COMMON-MODE CHANNEL SIGNAL TRANSMISSIONS

(71) Applicant: CommScope, Inc. of North Carolina, Hickory, NC (US)

(72) Inventor: Peter T. Tucker, Redmond, OR (US)

(73) Assignee: CommScope, Inc. of North Carolina, Hickory, NC (US)

( * ) Notice: Subject to any disclaimer, the term of this patent is extended or adjusted under 35 U.S.C. 154(b) by 396 days.

This patent is subject to a terminal disclaimer.

(21) Appl. No.: 13/755,512

(22) Filed: Jan. 31, 2013

(65) Prior Publication Data

US 2013/0141113 A1  Jun. 6, 2013

Related U.S. Application Data

(63) Continuation of application No. 12/169,016, filed on Jul. 8, 2008, now Pat. No. 8,382,501.

(51) Int. Cl.
*H01R 13/66* (2006.01)
*H01R 13/68* (2011.01)
(Continued)

(52) U.S. Cl.
CPC .............. *G01R 31/043* (2013.01); *H04L 49/40* (2013.01); *H04Q 1/136* (2013.01)

(58) Field of Classification Search
CPC .... H04Q 1/136; H01R 13/7175; H01R 24/64; H04L 12/24; H04L 41/00

USPC ........... 379/9, 9.04, 14, 15.01, 16, 21, 22.02, 379/22.06, 25, 26.01, 27.03, 29.01; 439/188, 191, 192, 194, 195, 208, 211, 439/217, 219, 260, 49, 620.11, 620.21, 676
See application file for complete search history.

(56) References Cited

U.S. PATENT DOCUMENTS 5,394,503 A  2/1995  Dietz et al.
6,222,908 B1  4/2001  Bartolutti et al.
(Continued)

FOREIGN PATENT DOCUMENTS

CN  1295766 A  5/2001
EP  1 788 825 A2  5/2007
(Continued)

OTHER PUBLICATIONS

First Office Action corresponding to Chinese Patent Application No. 200980134666.3, dated Apr. 1, 2013; 1 page.
(Continued)

*Primary Examiner* — Binh Tieu
(74) *Attorney, Agent, or Firm* — Myers Bigel Sibley & Sajovec (57) ABSTRACT

Communications patching system and methods utilizing common-mode channel communications are provided for identifying patch panel ports to which a backbone cable is connected in a communications patching system, for identifying a patch panel port to which a horizontal cable terminating at a telecommunications outlet is connected in a communications patching system, and for identifying the physical location of first and second connectors of a patch cord in a communications patching system having multiple patching zones.

13 Claims, 7 Drawing Sheets

(51) Int. Cl.
*H01R 24/00* (2011.01)
*H01R 27/00* (2006.01)
*H01R 29/00* (2006.01)
*G01R 31/04* (2006.01)
*H04Q 1/02* (2006.01)
*H04L 12/931* (2013.01)

(56) References Cited

U.S. PATENT DOCUMENTS

| | | |
|---|---|---|
| 6,424,710 B1 | 7/2002 | Bartolutti et al. |
| 6,784,802 B1 | 8/2004 | Stanescu |
| 6,968,994 B1 | 11/2005 | Ashwood Smith |
| 7,028,087 B2 * | 4/2006 | Caveney ............ 709/224 |
| 7,370,106 B2 | 5/2008 | Caveney |
| 7,376,734 B2 | 5/2008 | Caveney |
| 7,934,022 B2 | 4/2011 | Velleca et al. |
| 7,938,700 B2 * | 5/2011 | Jacks et al. ............ 439/88 |
| 8,128,428 B2 * | 3/2012 | Caveney et al. ............ 439/490 |
| 2003/0154273 A1 | 8/2003 | Caveney |
| 2006/0063406 A1 | 3/2006 | Shifris et al. |
| 2007/0238343 A1 | 10/2007 | Velleca et al. |
| 2008/0007372 A1 * | 1/2008 | Carroll ............ 333/260 |
| 2008/0122579 A1 | 5/2008 | German et al. |

FOREIGN PATENT DOCUMENTS

| | | |
|---|---|---|
| GB | 2236398 A | 4/1991 |
| WO | WO 99/26426 | 5/1999 |
| WO | WO 2006/075247 | 7/2006 |

OTHER PUBLICATIONS

Notification of Transmittal of the International Search Report and Written Opinion issued by the European Patent Office on Feb. 23, 2010 for the corresponding international application No. PCT/US2009/003851.

* cited by examiner

SYSTEMS AND METHODS OF IDENTIFYING CONNECTIONS IN A COMMUNICATIONS PATCHING SYSTEM USING COMMON-MODE CHANNEL SIGNAL TRANSMISSIONS

RELATED APPLICATION

This application is a continuation application of U.S. patent application Ser. No. 12/169,016, filed Jul. 8, 2008, the disclosure of which is incorporated herein by reference as if set forth in its entirety.

FIELD OF THE INVENTION

The present invention relates generally to communications systems and, more particularly, to communications patching systems.

BACKGROUND

A "data center" is a facility that is used to house computer systems and associated components, such as telecommunications equipment and memory storage systems. Data centers are used to, among other things, run the computer-based applications that handle the core business and operational data of one or more organizations. Typically, these applications are run on microcomputers that are typically referred to as servers and, in some instances, on mainframe computers.

Large data center operations may host thousands or even tens of thousands of servers. In many instances, data centers may be configured to provide double or even triple redundancy with respect to power feeds, backup power supplies, communications lines, memory storage and processing, and may have automated back-up capabilities. Data centers may also have layered network security elements including, for example, firewalls, VPN gateways, intrusion detection systems and the like. Data centers also may include monitoring systems that monitor the networked computer equipment and/or the applications running on the servers.

The expansion of the Internet has led to a growing need for large data center operations. Businesses making sales and/or providing services over the Internet typically require high-speed Internet connectivity, tight information security and non-stop operation. Major Internet-based companies such as large online retailers, Internet portals and search engine companies run large "Internet data centers" that host the thousands of servers and the other computer equipment necessary to provide large numbers of users simultaneous, secure, high-speed, fail-safe access to their web sites. Many small to medium-sized businesses may not have the resources and/or sophistication required to install and maintain the equipment necessary to provide such Internet-based access to their servers. Such businesses may also find it difficult to provide and maintain the highly trained, 24-hour a day staff that are typically necessary to repair or replace defective equipment (e.g., servers, cables, patch cords, computer cards, etc.), add new equipment, update outdated equipment and otherwise run a data center. Thus, to fill this market need, computer equipment makers and others are building and maintaining Internet data centers and then, for a fee, providing data center operations for a large number of businesses.

A data center may occupy one or more rooms or floors of a building, an entire building and/or a multi-building complex. The computer equipment housed in a data center may include, for example, servers, mainframe computers and memory storage and backup devices. Data centers also include routers, switches and patching systems that transport traffic between the servers, memory storage devices and the outside world. The computer equipment is often mounted on industry standardized equipment racks which are usually arranged in rows with corridors between them that allow access to the front and rear of each device. Elevated floors may be provided that are constructed of, for example large removable tiles. Cable trays may be installed overhead (including in the ceiling) and/or under the elevated floor. Cables and patch cords (a patch cord is a cable that has a connector on at least one end thereof) that are used to interconnect the equipment in the data center may be run through these cable trays.

Figure 1A:
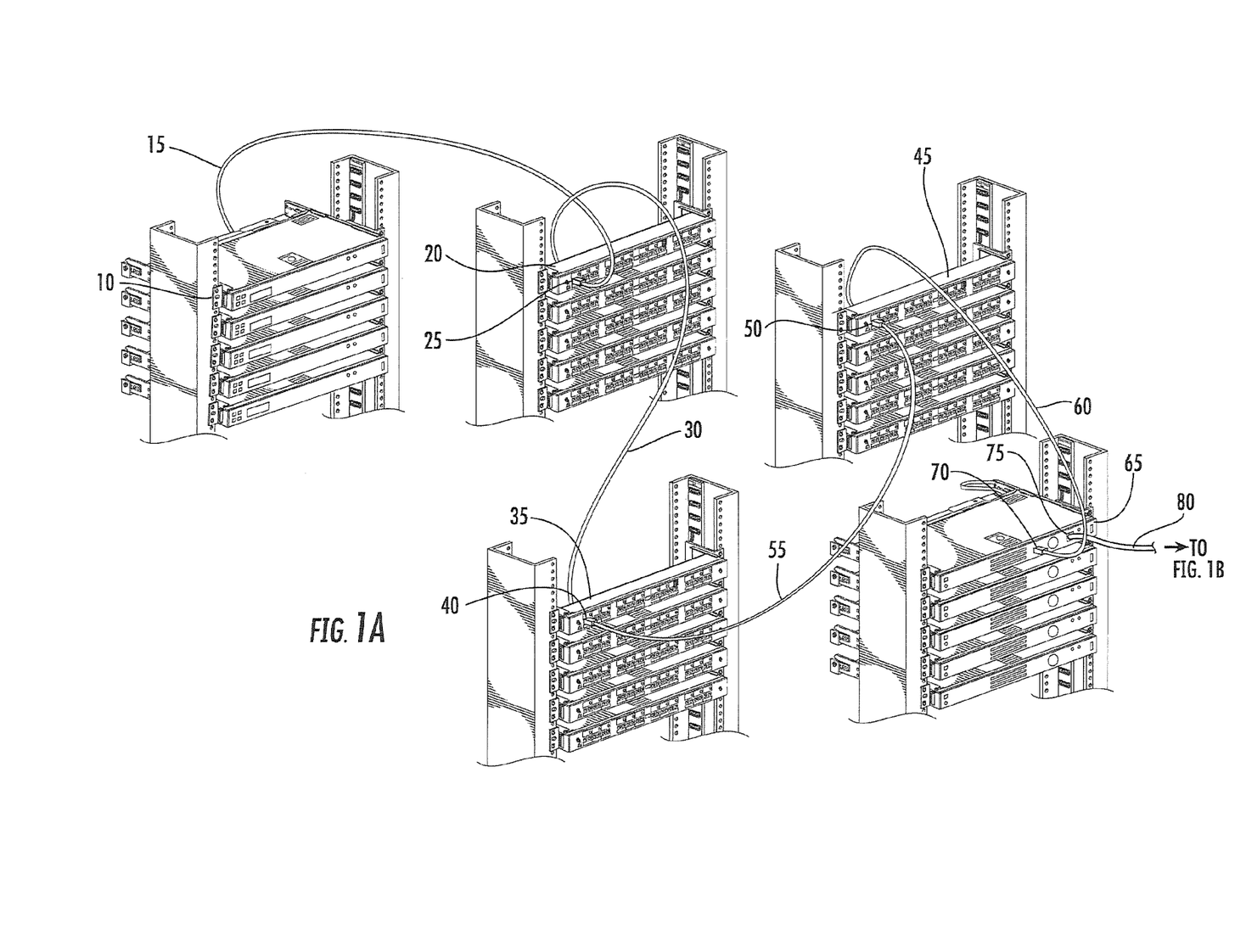
FIGS. 1A and 1B are a simplified schematic diagram of a prior art interconnection arrangement for connecting a server to a memory storage device in an Internet data center.
Figure 1B:
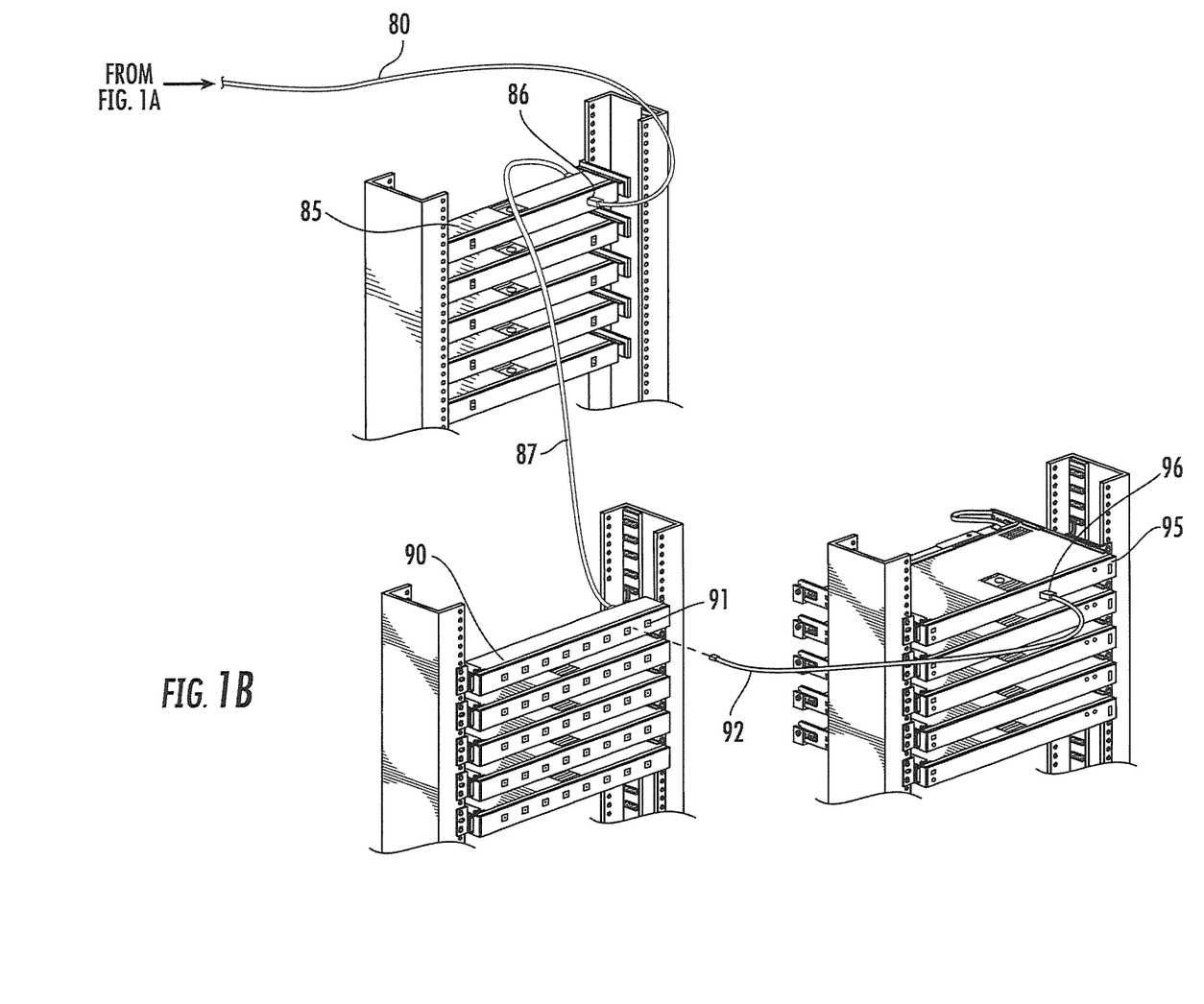

In most data center operations, the communications lines used to interconnect the servers, memory storage devices, routers and other computer equipment to each other and to external communication lines are typically run through sophisticated patching systems that may simplify later connectivity changes. FIGS. 1A-1B together are a simplified schematic diagram of the scheme that might be used in a data center to interconnect one particular server (e.g., server 10 in FIG. 1A) to one particular memory storage device (e.g., memory storage device 95 in FIG. 1B).

As shown in FIG. 1A, the rack-mounted server 10 is connected by a cable 15 to a rack-mounted patch panel 20. In the example shown in FIG. 1A, cable 15 is a patch cord, meaning that the cable 15 includes copper conductors and that each end of the cable 15 is terminated with a plug connector. Typically (but not always), the patch panel 20 will be located in the general vicinity of the server 10 so that the cable 15 may be implemented as a relatively short length patch cord. In FIG. 1A, cable 15 is plugged into one of the connector ports (connector port 25) on patch panel 20.

As is also shown in FIG. 1A, a "backbone" cable 30 is connected to the back end of connector port 25. Backbone cable 30 is typically routed through the floor and/or ceiling of the data center, and may run for large distances (particularly in data centers that occupy one or more buildings). A second rack-mounted patch panel 35 is also provided. As shown in FIG. 1A, the backbone cable 30 connects the back end of connector port 25 on patch panel 20 to the back end of a connector port 40 on the second patch panel 35. A third rack-mounted patch panel 45 is also provided. A patch cord 55 connects the front end of connector port 40 on patch panel 35 to the front end of a connector port 50 on patch panel 45. A cable 60 is connected to the back end of connector port 50 on patch panel 45. The other end of cable 60 is connected to a connector port 70 on a switch 65. The switch 65 is configured to provide connectivity between the connector port 70 on switch 65 that receives patch cord 60 to another connector port 75 on switch 70 into which a second patch cord 80 is inserted.

Continuing now to FIG. 1B, which is a continuation of FIG. 1A, it can be seen that the patch cord 80 connects to the front end of a connector port 86 on a fourth rack-mounted patch panel 85. As shown in FIG. 1B, a backbone cable 87 connects the back end of connector port 86 to the back end of a connector port 91 on a fifth rack-mounted patch panel 90. One end of a patch cord 92 is plugged into the front end of connector port 91 of patch panel 90 and the other end of patch cord 92 is plugged into a connector port 96 on a memory storage device 95. In the present example, patch panels 85 and 90 are fiber optic patch panels, and hence patch cords 80 and 92 and backbone cable 87 are fiber optic cables. Thus, as shown in FIGS. 1A and 1, the server 10 is connected to the memory storage device 95 through patch cord 15, patch panel 20, backbone cable 30, patch panel 35, patch cord 55, patch panel 45, cable 60, switch 70, patch cord 80, patch panel 85, backbone cable 87, patch panel 90 and patch cord 92. While only a single patch cord or cable has been illustrated as extending between each equipment rack in order to simplify the drawings, it will be appreciated that in normal operation the various other components and patch panels depicted in FIGS. 1A and 1B would typically have many more patch cords/cables connected thereto.

As computer equipment is, for example, added, moved or replaced in a data center, it often becomes necessary to make temporary and/or permanent changes to the interconnection scheme. For example, if a first memory storage device in a data center is scheduled to be replaced with a new memory storage device, servers and other computer equipment that use the first memory storage device may need to be temporarily connected to a second memory storage device until such time as the new memory storage device may be installed, configured, tested and brought online. The patching system depicted in FIGS. 1A and 1B may facilitate making such changes.

Unfortunately, record-keeping of the patching connections that are necessary to know which patch cord to move are not always 100% accurate. Conventionally, the interconnections of the various patch cords and cables in a data center were logged in a paper or a computer-based log. However, if a technician neglects to update the log each and every time a change is made, and/or makes errors in logging changes, then the paper or computer based logs will no longer be fully accurate. As a result, in some cases, each time a technician needs to change a patch cord, the technician would manually trace that patch cord between two connector ports by locating one end of the patch cord and then manually following the patch cord until he/she finds the opposite end of that patch cord.

However, in large scale data center operations the manual tracing of patch cords may be difficult or even impossible given the large number of connections, the cable routing mechanisms that are typically used to keep the cable portions of each patch cord out of the way and neatly routed and the spacing of the equipment. As such, systems for automatically detecting and logging patch cord connections have been proposed such as, for example, the systems disclosed in U.S. Pat. Nos. 6,222,908; 6,784,802; 6,424,710 and 6,968,994.

Current intelligent patching systems have the ability to automatically detect changes to patch cord connectivity. For this information to have commercial value, however, it may be necessary to associate patch panel port to patch panel port connectivity information detected automatically by an intelligent patching system with cabling information that shows how the patch panel ports in question are connected—via cables attached to the back side of each port—to other equipment at the site. By combining such fixed cabling information with real-time patch connectivity information, intelligent patching systems can display for users complete end-to-end circuit diagrams.

SUMMARY

In view of the above discussion, a method of identifying patch panel ports to which a backbone cable is connected in a communications patching system, according to some embodiments of the present invention, includes selecting a patching zone from a plurality of patching zones; transmitting a signal (e.g., an AC signal, a DC signal, etc.) with the backbone cable identification over a common-mode channel of a selected patch panel port in the selected patching zone; and scanning common-mode channels of patch panel ports in the non-selected patching zones to identify a patch panel port receiving the transmitted signal. These operations are repeated for each patch panel port in the selected patching zone until a connection is identified. In response to receiving the transmitted signal at a patch panel port, the connection between the patch panel port receiving the transmitted signal and the selected patch panel port transmitting the signal is documented, e.g. logged within a database.

According to some embodiments of the present invention, a communications patching system includes a plurality of patching zones, each patching zone containing one or more patch panels; a backbone cable that interconnects a first patch panel in a first patching zone and a second patch panel in a different second patching zone; and one or more processors in communication with the patch panels that are configured to select a patching zone from the plurality of patching zones and to cause a signal (e.g., an AC signal, a DC signal, etc.) with an identification of the backbone cable to be transmitted over a common-mode channel of a selected patch panel port in the selected patching zone, and to cause common-mode channels of patch panel ports in the non-selected patching zones to be scanned to identify a patch panel port receiving the transmitted signal. The one or more processors may be configured to document a connection between a patch panel port receiving the transmitted signal and the selected patch panel port transmitting the signal.

According to other embodiments of the present invention, methods of identifying a patch panel port to which a cable terminating at a telecommunications outlet is connected in a communications patching system, are provided. The communications patching system includes one or more patch panels, each having a plurality of ports, wherein the communications patching system includes a plurality of telecommunications outlets (e.g., wall jacks), each hardwired to a respective patch panel port via a "horizontal" cable to define a respective circuit. A signal (e.g., an AC signal, a DC signal, etc.) is transmitted, for example via a handheld testing device, via a common-mode channel of a circuit associated with a telecommunications outlet. The signal includes identification and location information for the telecommunications outlet. Common-mode channels associated with each of the patch panel ports are scanned to identify a patch panel port receiving the transmitted signal. A connection between the patch panel port receiving the transmitted signal and the telecommunications outlet transmitting the signal is documented, e.g., logged within a database. In some embodiments, the telecommunications outlet identification and location information is extracted from the signal and stored along with an identification of the patch panel port receiving the transmitted signal.

According to some embodiments of the present invention, a communications patching system includes a patch panel having a plurality of ports. Each port is connected to a telecommunications outlet via a cable to define a respective circuit. A processor in communication with the patch panel causes common-mode channels associated with each of the circuits to be scanned to identify a patch panel port receiving a signal (e.g., an AC signal, a DC signal, etc.) transmitted by a testing device at a respective telecommunications outlet. The processor is configured to document a connection between a patch panel port receiving a transmitted signal and a telecommunications outlet through which the signal was transmitted.

According to other embodiments of the present invention, methods of identifying the physical location of first and second connectors of a patch cord in a communications patching system having multiple patching zones include detecting the insertion of a patch cord connector into a first patch panel port; transmitting a signal (e.g., an AC signal, a DC signal, etc.) from the first patch panel port over a common-mode transmission path of the patch cord, wherein the signal contains an identification of a patching zone that the first patch panel port is located within; and scanning other patch panel ports in the communications patching system to identify a patch panel port receiving the transmitted signal. In response to identifying a patch panel port receiving the transmitted signal at a second patch panel port, the connection between the first patch panel port and a second patch panel port receiving the transmitted signal is documented, e.g., logged into a database. If a designated period of time has expired without identifying a patch panel port receiving the transmitted signal, it may be documented that the patch cord second connector has either not been inserted into a patch panel port or that the patch cord second connector has been inserted into a non-intelligent device.

According to some embodiments of the present invention, a communications patching system includes a plurality of patching zones with each patching zone containing one or more intelligent patch panels. Each intelligent patch panel includes a plurality of ports configured to detect insertion and removal of a patch cord connector therein. One or more processors are in communication with the patch panels that, in response to detecting insertion of a patch cord connector into a first patch panel port, are configured to cause a signal (e.g., an AC signal, a DC signal, etc.) to be submitted from the first patch panel port over a common-mode transmission path of the patch cord, and to cause other patch panel ports in the communications patching system to be scanned to identify a patch panel port receiving the transmitted signal. The transmitted signal contains an identification of a patching zone that the first patch panel port is located within. The one or more processors are configured to document a connection between the first patch panel port and a second patch panel port receiving the transmitted signal, e.g., logged within a database. In addition, the one or more processors are configured to document that a second connector of the patch cord has not been inserted into a patch panel port in response to not receiving the transmitted signal at a patch panel port within a designated period of time.

DETAILED DESCRIPTION OF EMBODIMENTS OF THE INVENTION

The present invention now is described more fully hereinafter with reference to the accompanying drawings, in which some embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present.

It will be understood that, although the terms "first", "second", etc. may be used herein to describe various elements, components, patch panels, etc., these elements, components, patch panels etc. should not be limited by these terms. These terms are only used to distinguish one element, component, patch panel, etc. from another element, component, patch panel. Thus, a "first" element, component, or patch panel discussed below could also be termed a "second" element, component, or patch panel without departing from the teachings of the present invention. In addition, the sequence of operations (or steps) is not limited to the order presented in the claims or figures unless specifically indicated otherwise.

Typically, a "patching zone" is a collection of one or more racks with patch panels that are located in sufficiently close proximity such that patch cords can be connected between any set of ports within that collection of racks. The patching equipment within a given communications closet typically constitutes a patching zone.

An "intelligent patch panel" is a patch panel that is configured to sense the insertion and removal of a patch cord in any of its ports.

In many conventional electrical communications systems, the information signals (e.g., video, audio, data) are typically transmitted over a pair of conductors (hereinafter a "differential pair" or simply a "pair") rather than a single conductor. The signals transmitted on each conductor of the differential pair have equal magnitudes, but opposite phases, and the information signal is embedded as the voltage difference between the signals carried on the two conductors. This transmission technique is generally referred to as "balanced" transmission. When signals are transmitted over a conductor such as a copper wire in a communications cable, electrical noise from external sources may be picked up by the conductor, degrading the quality of the signal carried by the conductor. With balanced transmission techniques, each conductor in a differential pair often may pick up approximately the same amount of noise from these external sources. Because approximately an equal amount of noise is added to the signals carried by both conductors of the differential pair, the information signal is typically not disturbed, as the information signal is extracted by taking the difference of the signals carried on the two conductors of the differential pair; thus the noise signal may be cancelled out by the subtraction process.

As would be understood by one skilled in the art of the present invention, transmission of a signal over a common-mode channel sends the same signal across each conductor of a pair of conductors in the same direction. In an Ethernet twisted pair, data is transmitted between endpoints using differential mode transmission. In a well balanced system, differential mode and common-mode transmission can coexist and not interfere with each other. Because a common-mode signal transmitted over a differential pair adds the same amount of signal energy to each wire of a differential pair, the common-mode signal subtracts out of, and hence does not degrade, the differential information signal. Embodiments of the present invention involve transmitting a common-mode signal over the differential pairs that are already part of patching systems.

Figure 2:
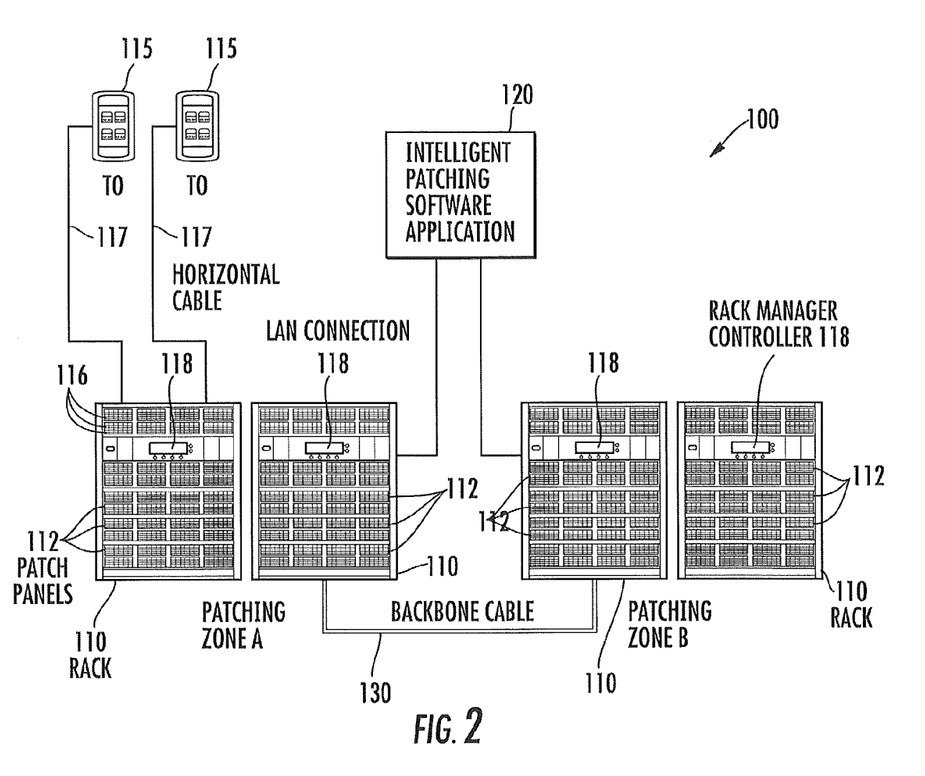
FIG. 2 illustrates an intelligent communications patching system configured to detect backbone cabling, document connectivity information between telecommunications outlets and patch panel ports, and document patch cord connectivity, according to some embodiments of the present invention.

Referring to FIG. 2, a communications patching system 100 in which various embodiments of the present invention may be implemented is illustrated. The patching system 100 includes a plurality of racks 110 each containing a respective plurality of intelligent patch panels 112 mounted therewithin. Each intelligent patch panel 112 includes a respective plurality of telecommunication connector ports 116 (e.g., RJ-45 ports, RJ-11 ports, etc.) that are hard wired to a respective communication line, as would be understood by one skilled in the art of the present invention. For example, a connector port 116 may be hard wired to a telecommunications outlet 115 via cabling 117, also referred to as a "horizontal" cable. As would be understood by those skilled in the art of the present invention, a telecommunications outlet 115 includes voice and/or data ports for receiving interconnections from devices such as telephones, desktop computers, etc. In a building, for example, one or more telecommunications outlets are typically located in each office and conference room.

The illustrated patching system 100 is divided into first and second patching zones A, B, each containing respective racks 110 of patch panels 112. Each rack 110 includes a rack manager controller 118 that communicates with the intelligent patch panels 112 on the respective rack 110, the other rack manager controllers 118 within a respective patching zone, and with intelligent patching software 120 that executes on one or more processors. The intelligent patching software 120 also includes a database and/or is configured to communicate with a database. The database is configured to store connectivity information between patch panel ports for patch cords and backbone cabling. The database is also configured to store connectivity information between telecommunications outlets and patch panel ports.

As is known by those of skill in the art, a database is a collection of data that is organized in "tables." A database typically includes a database manager that facilitates accessing, managing, and updating data within the various tables of a database. Exemplary types of databases that can be used for documenting connectivity information in a communications patching system, according to embodiments of the present invention, include, but are not limited to, relational databases, distributed databases (databases that are dispersed or replicated among different points in a network), and object-oriented databases. Relational, distributed, and object-oriented databases are well understood by those of skill in the art and need not be discussed further herein. Exemplary commercial databases that can be used to implement embodiments of the present invention include, but are not limited to, IBM's DB2® database, Microsoft's SQL server database, and other database products, such as those from Oracle, Sybase, and Computer Associates.

In addition to having the ability to sense the insertion or removal of patch cords, the patch panels 112 have the ability to connect a transmitter to the common-mode channel of a designated port 116, and repetitively send a designated identification code over that common-mode channel. Each patch panel 112 also has the ability to scan the common-mode channel of all of its ports 116, by sequentially connecting a receiver circuit to each port's 116 common-mode channel, and then checking to see if a common-mode signal conveying a designated identification code is detected.

Backbone cables 130 connect at least some of the patch panels 112 in the first and second patching zones A, B. Each backbone cable 130 is connected to the back side of selected patch panel ports 116. During installation of the communications patching system 100, embodiments of the present invention detect and document the backbone cables that interconnect various patching zones of a communications patching system.

Detection of Backbone Cabling

Figure 3:
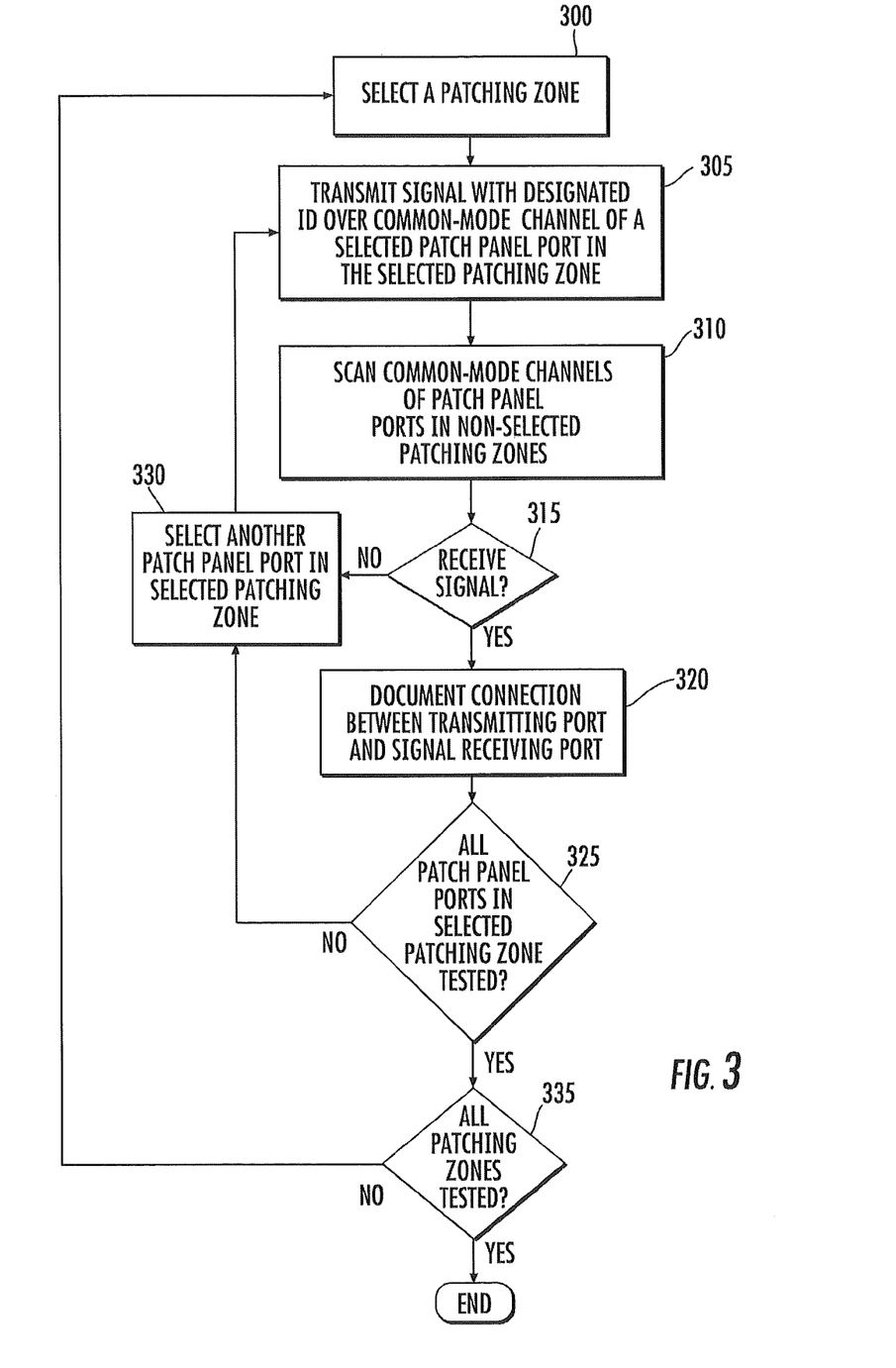
FIG. 3 is flow chart illustrating methods of detecting backbone cabling in a communications patching system, according to some embodiments of the present invention.

Referring to FIG. 3, a method of detecting backbone cabling in a communications patching system, according to some embodiments of the present invention, is illustrated. The communications patching system may be physically located within different geographical locations, within different locations of the same geographical location, among different floors of a building, etc. The patching system is divided into a plurality of patching zones. These patching zones may be geographically dispersed, as well, and are interconnected via backbone cabling. The following described steps may be performed prior to the installation of any patch cords in the patch panels of the patching system to identify connectivity information about the backbone cabling.

Initially, a patching zone is selected (Block 300) by the intelligent patching software application 120. A message is sent to the rack manager controllers 118 in all of the remaining patching zones of the patching system 100 requesting that their respective intelligent patch panels 112 continuously scan the common-mode channels of their respective ports, looking for a signal (e.g., an AC signal, a DC signal, etc.) carrying a designated backbone cable ID.

The intelligent patching software application 120 then selects a specific port 116 in the selected patching zone and sends a message instructing the respective rack manager controller 118 to activate signal transmission on the selected port's common-mode channel, using the specified ID. The rack manager controller 118, in turn, sends a message to the appropriate intelligent patch panel 112 telling it to repeatedly transmit a signal with the specified ID over the selected port's 116 common-mode channel (Block 305). The common-mode channels of patch panel ports in the non-selected patching zones are scanned for the transmitted signal (Block 310).

The intelligent patching software application 120 waits for a certain amount of time to see if a notification is received from any rack manager controller 118 in the non-selected patching zones that a port 116 on its respective rack 110 has received the signal being sent by the selected port 116. If such a notification is received (Block 315), the intelligent patching software application 120 documents connection information between the sending and receiving ports in its database (Block 320). For example, an identification of the panel 112 and port 116 receiving the signal and transmitting the signal are stored. These patch panel ports are connected via a backbone cable.

If no notification is received within a set time period (Block 315), the intelligent patching software application 120 assumes that the panel port transmitting the signal is not cabled to any other intelligent patch panel port in the patching system 100. The intelligent patching software application 120 then sends a command to the selected port (by way of its respective rack manager controller 118) to stop transmitting the specified ID value over its common-mode channel.

A determination is made whether all patch panel ports in the selected patching zone have been tested (Block 325). If the answer is no, the intelligent patching software application 120 selects another port 116 in the selected patching zone (Block 330) and operations represented by Blocks 305-320 are repeated. Operations represented by Blocks 305-320 are repeated for each intelligent panel port in the selected patching zone.

When all of the ports 116 in the selected patching zone have been tested, a determination is made whether all patching zones have been tested (Block 335). If the answer is no, the intelligent patching software application 120 selects a new patching zone, and repeats the operations represented by Blocks 300-330. This process continues until all ports in all patching zones have been tested. If a determination is made that all patching zones have been tested (Block 335), operations are terminated.

To speed up operations, the intelligent patching software application 120 can skip testing ports for which it has already discovered backbone cabling. For example, if testing of ports in patching zone A indicate that port A-3 is connected to port B-7 in patching zone B, then when patching zone B is tested, port B-7 can be skipped in the test sequence, since the intelligent patching software application 120 would already know at this point that B-7 is connected to A-3.

Document Connections Between Telecommunications Outlets and Patch Panel Ports Conventionally, when "horizontal" cable is installed between patch panels and telecommunications outlets, the technician installing the cable performs validation testing via a handheld testing device that verifies that the horizontal cable in question has been properly terminated, and meets the transmission performance criteria associated with a particular standard, such as TIA-568A CAT 6. As is normally the case with horizontal cabling validation testing, the tests would be run after horizontal cabling is installed at a site, but before any patch cords are installed at the patch panels.

According to embodiments of the present invention, a handheld testing device with the ability to transmit data over the common-mode channel of the circuit under test would be used to perform validation testing of horizontal cable runs at the time the cabling is first installed. The handheld testing device and the intelligent patching system 100 would interact as described below in FIG. 4 to document connection information between telecommunication outlets 115 and intelligent patch panel ports 116.

Figure 4:
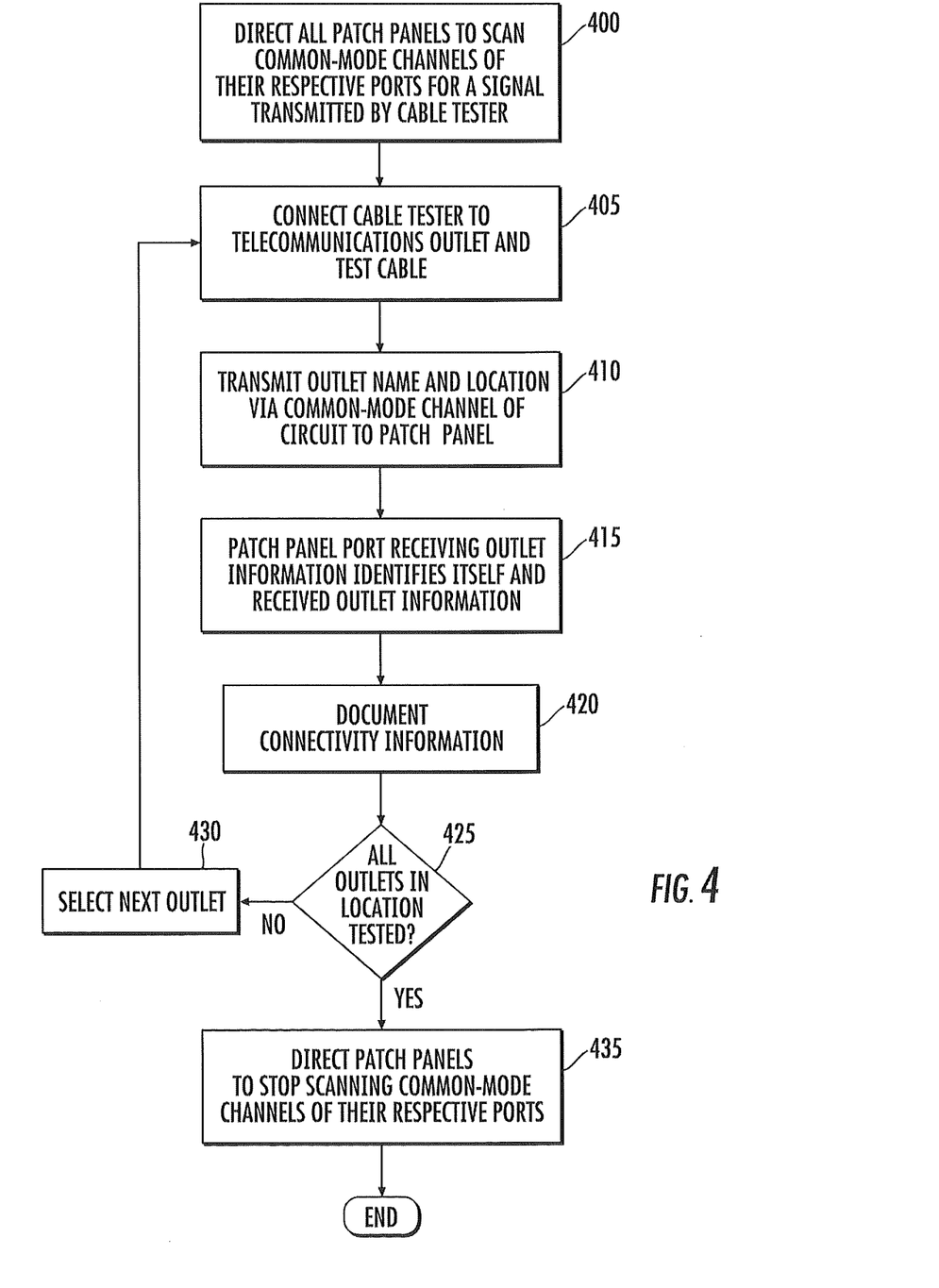
FIG. 4 is flow chart illustrating methods of documenting connectivity information between telecommunication outlets and intelligent patch panel ports, according to some embodiments of the present invention.

Prior to testing each horizontal cable run, a technician running the tests enters into the cable testing device the name of the telecom outlet being tested, as well as the location (e.g., office number, etc.) where the outlet in question is located. Before the start of horizontal cabling validation testing, the intelligent patching software application 120 directs all patch panels 112 to scan common-mode channels of their respective ports for a signal (e.g., an AC signal, a DC signal, etc.) transmitted by the cable testing device (Block 400). The cable testing device is then plugged into the outlet in question, activated, and testing is initiated (Block 405).

After the testing device completes its normal sequence of tests, it connects to the common-mode channel of the circuit in question, and transmits, via the common-mode channel, the name of the telecommunications outlet currently being tested, and the location of the outlet (Block 410). In some embodiments, the testing device transmits this information repeatedly for about 1.5 times the length of time that it takes the intelligent panels 112 to scan through all of their ports 116 one time. However, embodiments of the present invention are not limited to this length of time. The testing device may transmit the information for various time intervals, without limitation.

When the intelligent panel port 116 at the other end of the circuit in question detects the signal from the testing device on its common-mode channel, it extracts the outlet name and location information transmitted by the testing device and sends a message to its local rack manager controller 118 that includes this data, as well as the port number upon which the signal was detected (Block 415). The rack manager controller 118 then sends the rack, panel, and port number of the port that detected the signal, as well as the text information received from the testing device, to the intelligent patching software application 120 which documents the connectivity information (Block 420). For example, the intelligent patching software application 120 adds the telecommunications outlet name and location to a database (using the information received from the testing device), and documents the cabling connectivity between the outlet in question and the panel port that received the data from the testing device.

This process typically continues until all of the outlets in a location have been tested. For example, after Block 420 a determination is made if all outlets in a location have been tested (Block 425). If the answer is yes, operations end. If the answer is no, the technician moves to the next outlet and operations represented by Blocks 405-420 are repeated. Once all of the telecommunications outlets at a location have been tested, the intelligent patching software application 120 sends a message to all rack manager controllers 118 instructing them to return their respective patch panels 112 to idle mode and to stop scanning the common-mode channels of their ports (Block 435).

Document Patch Cord Connections

Figure 6:
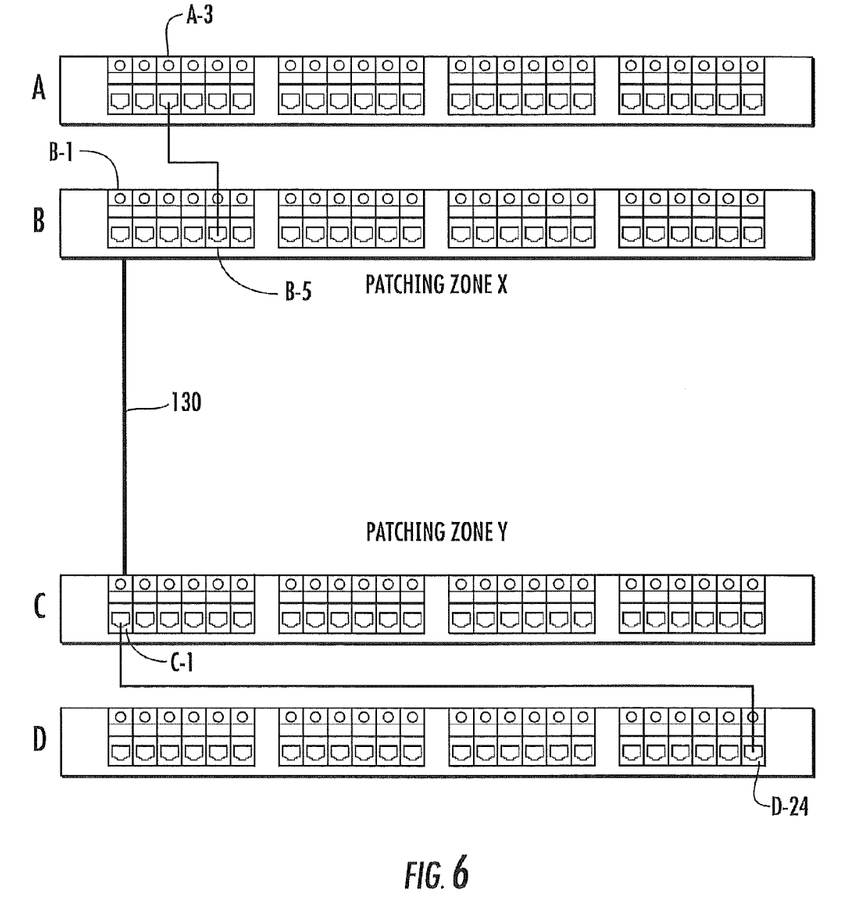
FIG. 6 illustrates patch panels located within different patching zones and connected together via a backbone cable.

In cases where patch panels are located in two respective patching zones, the transmission of generic signals over the common-mode channels to establish patching connectivity may result in the documentation of erroneous patching connections. For example, FIG. 6 illustrates a pair of patching zones, X and Y. Patch panels A and B are in patching zone X and patch panels C and D are in patching zone Y. Patch panel port B-1 and panel port C-1 are connected together by a backbone cable 130. Incomplete patch cords are present in Ports B-5 and C-1. At the same instant, the second ends of the two incomplete patch cords are plugged into ports A-3 and D-24 of their respective patching zones. As a result, ports A-3 and D-24 are instructed to start transmitting a signal on their respective common-mode channels, and the remaining ports in each patching zone are scanned to determine where the other end of the respective patch cords are connected. Because D-24 is patched to C-1, and C-1 is cabled to port B-1, port B-1 is connected to the same common-mode channel as port D-24. If patching zone X happens to scan port B-1 before port B-5, and the signal generated by port D-24 is indistinguishable from the signal generated by port A-3, then patching zone X will erroneously conclude that port A-3 is patched to port B-1, rather than port B-5.

Embodiments of the present invention may be used to document patch cord connectivity, particularly where patch panel ports in two separate patching zones are cabled to together such that they are each connected to the same common-mode channel. Embodiments of the present invention can solve the above-described problem by having each patching zone transmit a unique code when using the common-mode channel to determine patch-cord connectivity within its patching zone. If this were done in the example described above with respect to FIG. 6, then when patching zone X scanned port B-1, it would see patching zone Y's ID code, and would realize that port B-1 is not connected to port A-3, which is transmitting patching zone X's ID. It would then continue scanning until it tested port B-5, which would receive patching zone X's ID, thereby establishing it as the port that is actually connected to port A-3.

Figure 5:
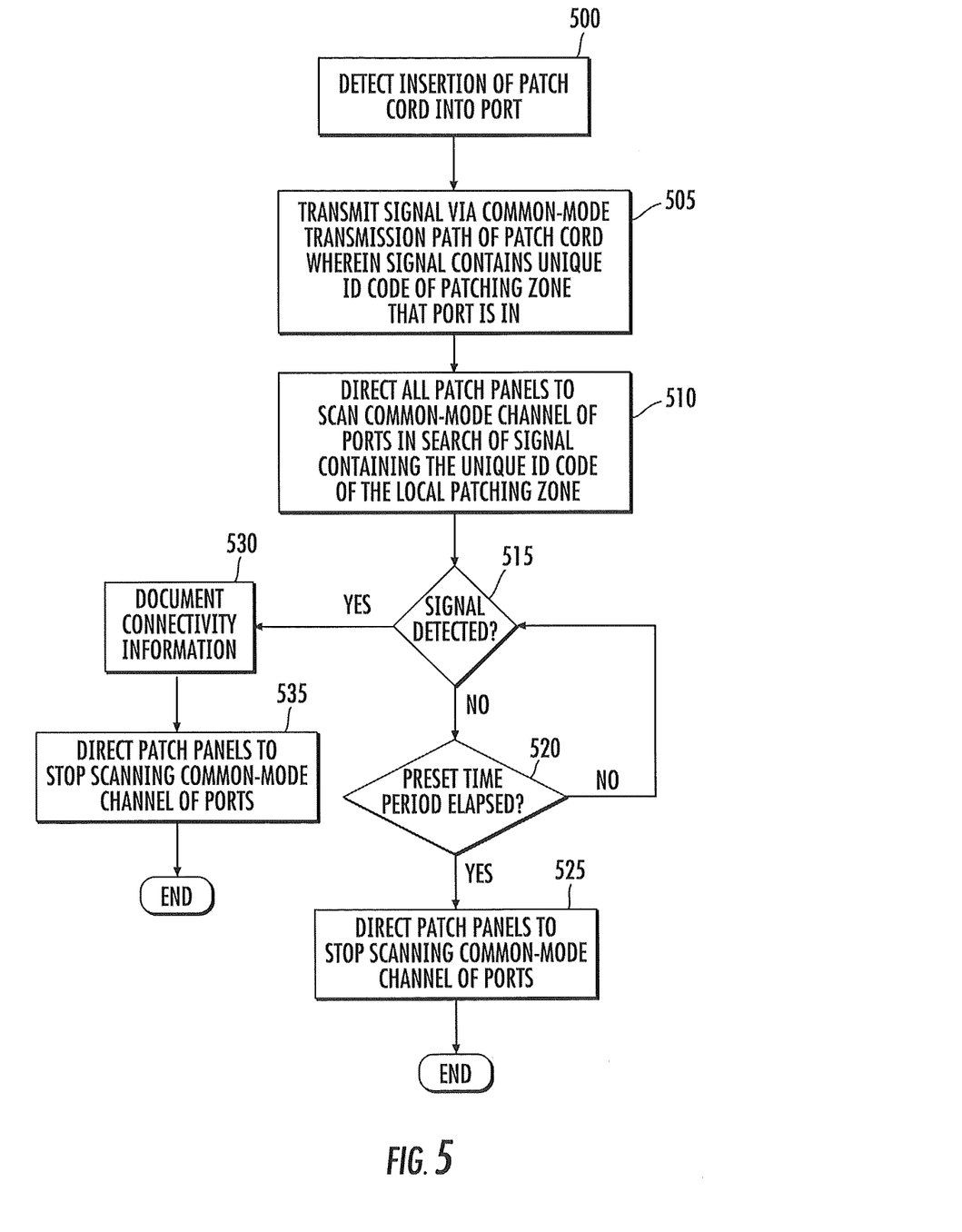
FIG. 5 is flow chart illustrating methods of detecting patch cord connectivity, according to some embodiments of the present invention.

Referring to FIG. 5, a method of detecting patch cord connectivity, according to some embodiments of the present invention, is illustrated. Initially, the insertion of a patch cord into a patch panel port 116 is detected by the intelligent patch panel 112 (Block 500) and is reported to the respective rack manager controller 118. The rack manager controller receiving the patch cord insertion event message instructs the respective patch panel to connect its transmission circuit to the common-mode channel of the port with the new patch cord, and transmit repeatedly a signal (e.g., an AC signal, a DC signal, etc.) containing the patching zone's unique identification code (Block 505).

The rack manager controller 118 receiving the patch cord insertion event message broadcasts a message to all of the rack manager controllers in the patching zone, including itself, indicating that a patch cord has been inserted in a particular rack, panel, and port. Upon receipt of this message, each rack manager controller 118 within the patching zone will send a message to all of the intelligent patch panels 112 on its respective rack, directing the patch panels to enter scanning mode whereby they connect a receiver circuit to each of their port's common-mode channel (e.g., one by one, in sequence), and search for the presence of a signal carrying the local patch zone's identification code (Block 510). Each rack manager controller 118 will also store the rack, panel, and port information of the port that has just had the patch cord plug inserted.

If the signal containing the local patching zone's ID is detected at a patch panel port (Block 515), the connectivity information is documented (Block 530), i.e., the rack(s) at each end of the patch cord will update a database(s) with information about the patch connectivity that has just been detected. For example, if one of the patch panels successfully detects the signal containing the local patching zone's ID, it will send the ID of the port on which the signal was detected to its local rack manager controller, which in turn will broadcast this message to the other rack manager controllers 118 within the patching zone, giving the rack, panel, and port number of the port that detected the signal. Upon receipt of this message, each rack manager controller will instruct all of the panels on its local rack to stop scanning their ports (Block 535), and the rack manager controller on the rack whose patch panel is transmitting the test signal will be instructed to end the signal transmission.

If the signal containing the local patching zone's ID is not detected at a patch panel port (Block 515), and if a preset period of time has elapsed (Block 520), the rack manager controller 118 on the rack where the patch cord plug insertion occurred will broadcast a message to all of the rack manager controllers 118 within the patching zone, including itself, telling them to return to idle mode. This will cause each rack manager controller 118 to send a message to all of the intelligent panels 112 on its local rack, telling them to stop scanning each of their port's common-mode channel (Block 525). The patch panel transmitting the signal on the common-mode channel of the port that has just had the patch cord inserted will also be instructed to stop sending this signal. In this case, the rack manager controller 118 on the rack with the patch panel that has just had the patch cord plug inserted will conclude that either the other end of the patch cord in question has yet to be inserted in an intelligent panel port, or else that the other end of the patch cord in question has been inserted into a non-intelligent patch panel or equipment such as a LAN switch.

If the signal containing the local patching zone's ID is not detected at a patch panel port (Block 515), but a preset period of time has not elapsed (Block 520), the patch panels 112 will remain in scanning mode until either the signal is detected (Block 515) or the preset time period has elapsed (Block 520).

The unique ID used by each patching zone could be derived from another unique ID already known to the patching zone. For example, the ID transmitted could be the host portion of the IP address assigned to the rack manager controller's ethernet interface that is used to communicate with the intelligent patching system's host software. Similarly, a portion of the MAC ID assigned to this Ethernet interface could also be used. An advantage of such an approach is that unique IDs can be generated automatically within each patching zone, without the need for customers to create these IDs and enter them into the intelligent patching system 100.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A method of determining the connectivity of a backbone cable in a communications patching system that includes a plurality of patch panel ports, the method comprising:
 a) transmitting a common-mode signal over a common-mode channel of a first of the plurality of patch panel ports that is connected to a first end of the backbone cable, where the first of the plurality of patch panel ports is located in a first patching zone, wherein the common-mode signal is transmitted via each conductor of at least one pair of conductors in the backbone cable;

b) scanning common-mode channels of ones of the plurality of patch panel ports that are located in a patching zone other than the first patching zone to determine that the common-mode signal is being received at a second of the plurality of patch panel ports; and c) identifying the second of the plurality of patch panel ports as being connected to a second end of the backbone cable based at least in part on receipt of the common-mode signal.

2. The method of claim 1, further comprising documenting a connection between the first and second of the plurality of patch panel ports.

3. The method of claim 2, wherein documenting the connection comprises logging an identification of the first and second patch panel ports in a database.

4. The method of claim 1, further comprising performing steps a) through c) for each of the plurality of patch panel ports in the first patching zone.

5. The method of claim 1, wherein each of the plurality of patch panel ports comprises an RJ-45 jack.

6. A method of identifying a cabling connection in a communications patching system that includes a plurality of telecommunications outlets, one or more patch panels, each patch panel having a plurality of patch panel ports, and a plurality of cables that connect respective ones of the telecommunications outlets to respective ones of the patch panel ports, the method comprising:

transmitting a common-mode signal via a common-mode channel associated with a first of the telecommunications outlets, wherein the common-mode signal is transmitted via each conductor of at least one pair of conductors in a cable connecting the first of the telecommunications outlets with a respective patch panel port;

scanning common-mode channels associated with at least some of the patch panel ports to identify a first of the patch panel ports that receives the transmitted common-mode signal; and identifying the cabling connection between the first of the telecommunications outlets and the first of the patch panel ports based at least in part on receiving the common-mode signal at the first of the patch panel ports.

7. The method of claim 6, further comprising documenting the cabling connection between the first of the patch panel ports and the first of the telecommunications outlets.

8. The method of claim 7, wherein documenting a the cabling connection comprises extracting the telecommunications outlet location information from the received common-mode signal and storing the extracted information along with an identification of the first of the patch panel ports.

9. The method of claim 6, wherein the common-mode signal is transmitted using a testing device.

10. A communications patching system, comprising:

a patch panel comprising a plurality of ports, each port connected to a respective one of a plurality of telecommunications outlets via a respective cable to define a respective circuit; and a receiver in communication with the patch panel that is configured to scan common-mode channels associated with each of the circuits to identify a patch panel port receiving a signal transmitted by a device at a respective one of the plurality of telecommunications outlets, wherein the signal is a common-mode signal transmitted via each conductor of at least one pair of conductors in a cable connecting the respective one of the plurality of telecommunications outlets with a respective patch panel port.

11. The communications patching system of claim 10, further comprising a processor that is configured to document a connection between the patch panel port receiving the transmitted signal and the one of the plurality of telecommunications outlets through which the signal was transmitted.

12. The communication patching system of claim 10, wherein the receiver sequentially scans the common-mode channels.

13. The communications patching system of claim 10, wherein the device comprises a testing device, and wherein the testing device is configured to include location information for the one of the plurality of telecommunications outlets in the signal transmitted by the testing device.

* * * * *